United States Patent
Barlini et al.

(10) Patent No.: US 10,048,303 B2
(45) Date of Patent: Aug. 14, 2018

(54) METHOD AND SYSTEM FOR MONITORING A PANTOGRAPH OF A RAILWAY VEHICLE AND RAILWAY VEHICLE

(71) Applicant: Alstom Transport Technologies, Saint-Ouen (FR)

(72) Inventors: Davide Barlini, Milan (IT); Donato-Carlo Loguercio, Milan (IT)

(73) Assignee: Alstom Transport Technologies, Saint-Ouen (FR)

( * ) Notice: Subject to any disclaimer, the term of this patent is extended or adjusted under 35 U.S.C. 154(b) by 0 days.

(21) Appl. No.: 15/346,128

(22) Filed: Nov. 8, 2016

(65) Prior Publication Data

US 2017/0131337 A1 May 11, 2017

(30) Foreign Application Priority Data

Nov. 9, 2015 (EP) ..................................... 15306778

(51) Int. Cl.
*G01R 31/00* (2006.01)
*B60L 5/04* (2006.01)
(Continued)

(52) U.S. Cl.
CPC .......... *G01R 31/008* (2013.01); *B60L 3/0023* (2013.01); *B60L 5/045* (2013.01); *G01R 31/14* (2013.01); *B60L 2200/30* (2013.01)

(58) Field of Classification Search
None
See application file for complete search history.

(56) References Cited

U.S. PATENT DOCUMENTS 4,024,444 A * 5/1977 Dewan .................... H02P 27/06
                                                                    318/805
9,834,237 B2 * 12/2017 Plotnikov ................. B61L 3/18
(Continued)

FOREIGN PATENT DOCUMENTS

DE           25 19 579 A1    4/2012
JP           4-251501 A      9/1992
(Continued)

OTHER PUBLICATIONS

Machine English Translation of KR 2012-0031554.*
European Patent Application No. 15306778.0, European Search Report, dated Apr. 29, 2016, 2 pages.

*Primary Examiner* — Jermele M Hollington
*Assistant Examiner* — Douglas X Rodriguez
(74) *Attorney, Agent, or Firm* — Soquel Group LLC

(57) ABSTRACT

A system for monitoring a pantograph of a railway vehicle, the pantograph being adapted to be connected to a catenary and electrically connected to a traction unit, the catenary being adapted to provide an alternating current to the railway vehicle, the system further including: a voltage step detection device for detecting a voltage step of a pantograph voltage at the pantograph, a zero crossing detection device for detecting a zero crossing of a line current, the line current being a portion of a pantograph current provided to the traction unit, the pantograph current being the current flowing through the pantograph; and a bouncing detection portion adapted to determine at least one bouncing time of the pantograph based on one or more detected voltage steps of the voltage step detection device and/or one or more detected zero crossings of the zero crossing detection device.

14 Claims, 5 Drawing Sheets

(51) Int. Cl.
*B60L 3/00* (2006.01)
*G01R 31/14* (2006.01)

(56) References Cited

U.S. PATENT DOCUMENTS

| | | | | |
|---|---|---|---|---|
| 2002/0014383 A1* | 2/2002 | Brooks | ...................... | B60L 5/00 |
| | | | | 191/33 R |
| 2010/0006385 A1* | 1/2010 | Aubigny | ................... | B60L 3/00 |
| | | | | 191/2 |
| 2011/0030574 A1* | 2/2011 | Kitanaka | ................... | B60L 5/28 |
| | | | | 105/49 |
| 2012/0013743 A1* | 1/2012 | Tanarro Marquez | ..... | B60L 5/26 |
| | | | | 348/148 |

FOREIGN PATENT DOCUMENTS

| | | |
|---|---|---|
| JP | 11-46402 A | 2/1999 |
| JP | 2008-157787 A | 7/2008 |
| KR | 2012-0031554 A | 4/2012 |
| RU | 2011127856 A | 1/2013 |
| WO | 2010/084287 A2 | 7/2010 |

* cited by examiner

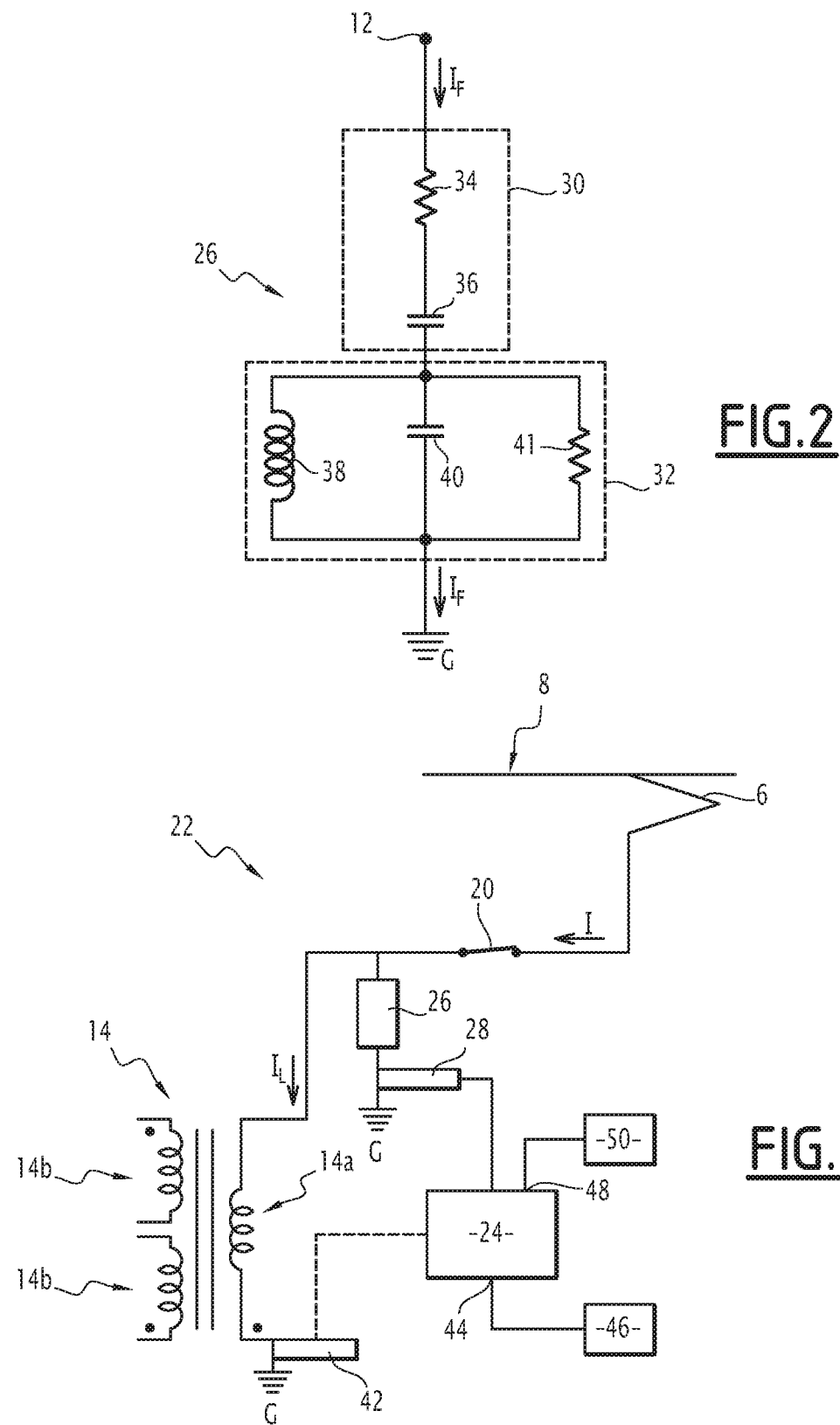

METHOD AND SYSTEM FOR MONITORING A PANTOGRAPH OF A RAILWAY VEHICLE AND RAILWAY VEHICLE

CROSS REFERENCE TO RELATED APPLICATIONS

This application claims priority benefit of EP Application No. 15 306 778.0 entitled METHOD AND SYSTEM FOR MONITORING A PANTOGRAPH OF A RAILWAY VEHICLE AND RAILWAY VEHICLE, filed on Nov. 9, 2015 by inventors Davide Barlini and Donato-Carlo Loguercio.

FIELD OF THE INVENTION

The present invention concerns system for monitoring a pantograph of a railway vehicle. Further, the present invention relates to a railway vehicle comprising a pantograph adapted to be connected to a catenary, a traction unit electrically connected to the pantograph, and an electric motor connected to the traction unit and such a system.

Finally, the present invention relates to a method for monitoring a pantograph of a railway vehicle.

BACKGROUND OF THE INVENTION

JP 2008-81690984 discloses a contact-force measuring device for a voltage drop type pantograph. The device measures the voltage from a pantograph so as to measure the pantograph contact force from the changes in the voltage. The system comprises a high pass filter or a frequency analyzer connected to a measuring instrument.

Further, according to the European standard EN 50317-2012 a monitoring system should take into account that all couples of sequential detachment with a return time<=1 s are considered as a unique detachment and a single detachment with time duration below 5 ms are not taken into account. Further, according to the standard the time duration of each arc generation, the train speed during the test, the number of arc, the sum of the duration of all arcs, the duration of the longest arc, the total operative time of the controlled section and the percentage of arcs should be determined.

SUMMARY OF THE DESCRIPTION

Object of the invention is to provide a method and a system for monitoring a pantograph of a railway vehicle, which functions in a reliable manner.

According to an aspect, a system for monitoring a pantograph of a railway vehicle is provided, the pantograph being adapted to be connected to a catenary and electrically connected to a traction unit, the catenary being adapted to provide an alternating current to the railway vehicle, the system further comprising: a voltage step detection device for detecting a voltage step of a pantograph voltage at the pantograph, a zero crossing detection device for detecting a zero crossing of a line current, the line current being a portion of a pantograph current provided to the traction unit, the pantograph current being the current flowing through the pantograph; and a bouncing detection portion adapted to determine at least one bouncing time of the pantograph based on one or more detected voltage steps of the voltage step detection device and/or one or more detected zero crossings of the zero crossing detection device.

According to some embodiments the system may comprise one or more of the following features, which may be combined in any technical feasible combination:

- the bouncing detection portion adapted to detect at least one arc time of an electrical arc between the pantograph and the catenary based on one or more detected voltage steps of the voltage step detection device and/or one or more detected zero crossings of the zero crossing detection device;
- the voltage step detection device comprises a signal generation portion, which is adapted to generate a first signal based on a detected voltage step, wherein the bouncing detection portion is adapted to determine the at least one bouncing time of the pantograph based on the first signal;
- the voltage step detection device comprises a filter circuit, which is connected in parallel to the traction unit and which is, in particular, adapted to generate an oscillating filter current in response to a voltage step of the pantograph current;
- the oscillating filter current oscillates in a predetermined frequency.
- the voltage step detection device comprises a first detection unit being adapted to detect the oscillations of the filter current, wherein the signal generation portion is connected to the first detection unit and adapted to generate the first signal based on the detected filter current;
- the signal generation portion comprises a band pass filter, which as centered to the predetermined frequency;
- the zero crossing detection device comprises a zero crossing detector, which is adapted to generate a second signal based on a detected zero crossing of the line current, wherein the bouncing detection portion is adapted to determine the at least one bouncing time of the pantograph based on the second signal and/or first signal;
- the zero crossing detection device comprises a second detection unit being adapted to detect the line current, wherein the zero crossing detector is connected to the second detection unit, in particular via a low pass filter, and adapted to generate the second signal based on the detected line current;
- the bouncing detection portion includes a state machine comprising a first state, when the pantograph is connected to the catenary and at least one second state and/or third state, when the pantograph is disconnected from the catenary, wherein the state machine is adapted to pass over between the first, second and/or third states based on a detected voltage step, in particular the first signal, and a detected zero crossing, in particular the second signal, wherein the determined bouncing time is determined based on a first time of the transition from the first state to the second state and a second time of the transition from one of the second or third states back to the first state; and/or
- the second state defines that there is an arc between the pantograph and the catenary and the third state defines that there is no arc between the pantograph and the catenary, wherein the state machine is adapted to pass over from the second to the third state upon a detected zero crossing, in particular the second signal, and to pass over from the third state to the second state upon a detected voltage step, wherein determined arc time is determined based on the time the state machine is in the second state.

According to a further aspect, the present invention relates to a railway vehicle comprising a pantograph adapted to be connected to a catenary, a traction unit electrically connected to the pantograph, and an electric motor connected to the traction unit and a system according to an embodiment disclosed herein.

According to another aspect, a method for monitoring a pantograph of a railway vehicle is provided, the pantograph being adapted to be connected to a catenary and electrically connected to a traction unit, the catenary being adapted to provide an alternating current to the railway vehicle, the method comprising:
 detecting a voltage step of a pantograph voltage at the pantograph,
 detecting a zero crossing of a line current, the line current being a portion of a pantograph current provided to the traction unit, the pantograph current being the current flowing through the pantograph; and
 determining at least one bouncing time of the pantograph based on one or more detected voltage steps and/or one or more detected zero crossings.

According to some embodiments the method may comprise one or more of the following features, which may be combined in any technical feasible combination:
 detecting at least one arc time of an electrical arc between the pantograph and the catenary based on one or more detected voltage steps and/or one or more detected zero crossings.

According to some embodiments, the method is performed on a system according to one or more embodiments disclosed herein.

Further advantages, features, aspects and details are evident from the dependent claims, the description and the drawings.

BRIEF DESCRIPTION OF THE DRAWINGS

So that the manner in which the above recited features of the present invention can be understood in detail, a more particular description of the invention, briefly summarized above, may be read by reference to embodiments. The accompanying drawings relate to embodiments of the invention and are described in the following:
FIG. 2 shows a high voltage filter of the monitoring system;
FIG. 3 shows schematically an embodiment of the monitoring system in more detail.

DETAILED DESCRIPTION

Figure 1:
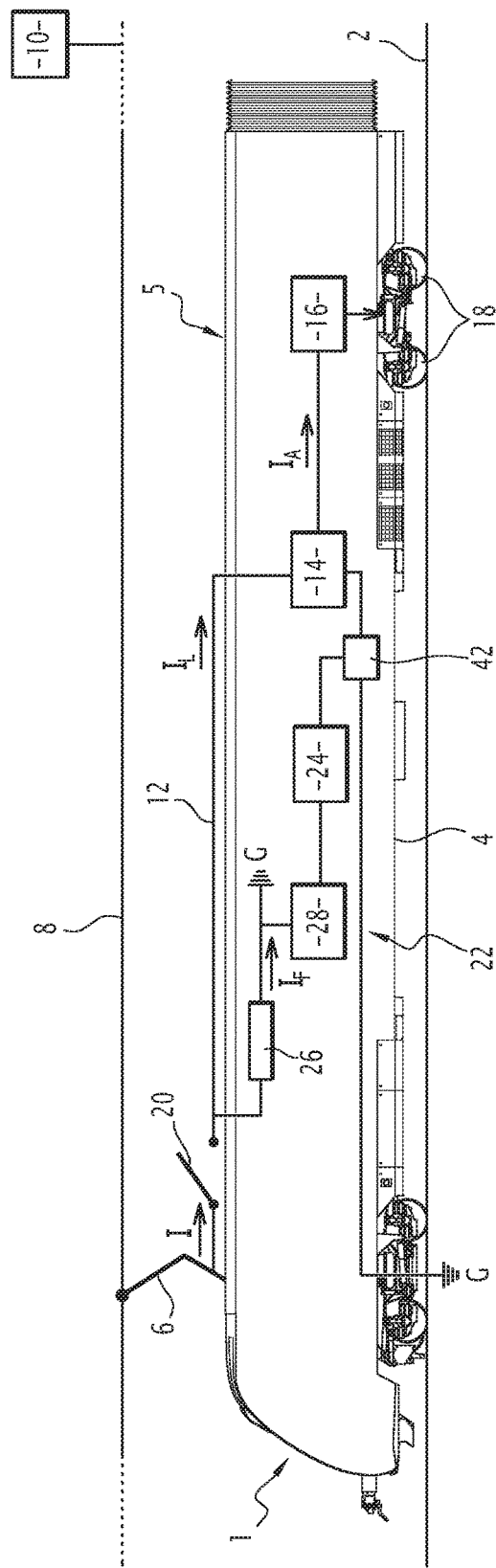
FIG. 1 shows a railway vehicle comprising a monitoring system according to the invention.

FIG. 1 shows a railway vehicle 1, for example a train or a tramway, which is adapted to move along a track 2. The railway vehicle includes a body 4 comprising a roof 5. A pantograph 6 is mounted on the roof 5. The pantograph 6 is adapted to contact a catenary 8 in which a current is provided to supply the railway vehicle 1. The catenary 8 is supplied by a central power supply 10. Thus, the catenary 8 forms a power supply for the railway vehicle 1.

The railway vehicle 1 further comprises an external line 12 provided to connect the pantograph 6 to a traction unit 14. Thus, the current of the catenary 8 is provided to the traction unit 14. A current I is flowing in the pantograph. The traction unit 14 is provided to provide a current $I_A$ to one or more electric motors 16, which are connected to wheels 18 of the railway vehicle 1. For example, the traction unit 14 includes a transformer, and/or a current converter, for example for generating a three phase current in the correct frequency for the one or more electric motors 16. In an embodiment, the external line 12 may be provided with a circuit breaker 20 to cut the electric connection between the traction unit 14 and the pantograph 6.

Further, the system comprises a monitoring system 22. The monitoring system 22 is for example at least partly adapted to be placed on the roof 5 of the railway vehicle 1 when the pantograph 6 is certified. The monitoring system 22 is adapted to monitor the pantograph 6 of the railway vehicle 1, in particular to monitor the bounces of the pantograph 6 and the arc time.

During the certification the total percentage NQ of disconnected pantograph 6 with respect to the catenary 8 is measured, for example by using the following formula:

$$NQ = \frac{Z_i t_i}{\tau} \times 100 \qquad \text{(Equation 1)}$$

In this equation $t_i$ is the detachment time or disconnection time for a bounce i of the pantograph 6 and T the total observation time. In other embodiments, for example according to the standard EN 50317-2012, $t_i$ is the arcing time which defines NQ. It should be noted that generally the arcing time is shorter than detachment time. Further, also other values have to be determined, like the number of arcs, the sum of the duration of all arcs, the duration of the longest arc, the total operative time of the controlled section and the percentage of arcs.

The monitoring system 22 comprises in particular a control unit 24, a high voltage filter 26 and a first detection unit 28. The control unit 24 may also include further components, which will be explained later.

As it is shown in FIG. 2, the high voltage filter 26 comprises a first portion 30 and a second portion 32 which are connected in series. Typically, the high voltage filter 26 of the monitoring system 22 is placed on the roof. The purpose of the high voltage filter is to produce upon a voltage step an oscillation at a specific frequency.

The first portion 30 comprises a resistance 34 and a capacitor 36, which are connected in series. The function of the resistance 34 is to damp the oscillation in the high voltage filter 26. In other embodiments the filter topology could be different putting this resistance in series with inductance and capacitors, in particular with a very small value to reduce inrush current. According to an embodiment, the resistance 34 has a value of between 10 and 50 Ohm, for example between 20 and 30 Ohm, in particular about 25 Ohm. In other embodiment, the value may be zero if another resistance is in series with an inductance of the high voltage filter. According to an embodiment, the capacitor 36 is designed to support 25 kV. The capacitor 36 is a value between 60 and 120 nF, in particular between 80 and 100 nF, for example about 89.6 nF. In some embodiments, instead of one capacitor a plurality of capacitors are used, which are connected in series. According to other embodiments, the capacitors range could be different, because the main function of the high voltage filter 26 is to produce a damped oscillation at specific frequency. In other words, several set of parameters for the capacitors, the resistances and the inductances can be applied.

The second portion 32 comprises an inductance 38, a capacitor 40 and a resistance 41, which are connected in parallel. The inductance 38 has a value of between 2 and 3 mH, in particular about 2.25 mH. It should be noted that this value is linked to the oscillation frequency desired. The capacitor 40 is a value between 60 and 120 nF, in particular between 80 and 100 nF, for example about 88.4 nF. The resistance 40 has a value of 800 to 1200 Ohm, in particular between 900 and 1100 Ohm, for example 1000 Ohm. The resistance 40 acts as a damping element for an oscillation in the high voltage filter 26. As already noted above, several set of parameters or values for the capacitors 36, 40 resistances 34, 41 and the inductance 38 may be used, to produce a damped oscillation with a desired oscillation frequency.

According to an embodiment, which may be combined with other embodiments disclosed herein, the parameters of the first and second portions 30, 32 of the high voltage filter 26 chosen to have an oscillation frequency in a predetermined range, where no disturbance comes from a converter, for example a four quadrant converter, and which permits to acquire samples at a specific predetermined acquisition rate, for example at 50 kilosamples/s. For example, the acquisition rate is dependent on the calculation power of the control unit. Typically a converter of the traction unit 14 includes rectifiers which produce harmonics in the range of 1 kHz to 4 kHz.

If a step voltage is applied across both capacitors 36, 40, the inductance 38 acts as open circuit and permits to charge capacitor 40. The resistance 34 is adapted to limit the inrush current during the charging and discharging phase. During the discharging phase of the capacitor 40, the frequency of the oscillation circuit is determined by the following equation:

$$f_{HZ} = \frac{1}{2\pi\sqrt{L_f(C_{f1} + C_{f2})}}, \quad \text{(Equation 2)}$$

where $f_{HZ}$, is the oscillation frequency, $L_f$ is the inductance 38, $C_{f1}$ is the capacitance of capacitor 36 and $C_{f2}$ is the capacitance of capacitor 40. For example, the oscillation frequency is between 5 kHz and 20 kHz, in particular around 9 kHz.

According to an embodiment, which may be combined with other embodiments disclosed herein, the oscillation has to be damped within 500 μs, in particular within 100 μs. According to some embodiments, the damping time has to satisfy two opposite requirements: to make an oscillation long enough to permit the acquisition system to detect oscillation with low sampling rate (50 kS/s for example) and to be short enough to provides high accuracy on the measurement of bouncing time. The second requirement defines the resolution in time of the measurement system. To consecutive triggers define one bounce, so the first one should be shorter enough to not interfere with the second one.

The first detection unit 28 is adapted to detect a filter current $I_F$ between the high voltage filter circuit 26 and the ground G. According to another embodiment, the first detection unit 28 may be electrically arranged before the filter circuit 26 in direction of the catenary 6. According to an embodiment, the first detection unit 28 comprises a Rogosky coil. Alternatively, also a transformer current sensor or other current sensors may be used. In another embodiment, the first detection unit is adapted to measure a voltage across the capacitor 40. In other words, the first detection unit is adapted to measure the oscillations in the high voltage filter circuit 26.

A step voltage is generated by a pantograph 6 disconnecting or connecting to the catenary 8, if the pantograph current I is not zero.

The first detection unit 28 is connected to the control unit 24 so that the control unit is able to receive the values of the filter current $I_F$.

FIG. 3 shows in more detail the monitoring system 22 according to an embodiment. The same features as in FIG. 1 are designated with the same reference numbers. In FIG. 3, the traction unit 14 comprises a transformer comprising a primary coil 14a and two secondary coils 14b.

In an embodiment, a second detection unit 42 is provided between the primary side, in particular the primary coil 14a, of the transformer and the ground G. In another embodiment, the detection unit 42 may be provided upstream of the primary coil 14a. The second detection unit 42 is connected to the control unit 24. The second detection unit 42 is provided to detect a line current $I_L$. According to an embodiment, the second current detector 42 is or comprises a Rogosky coil. Alternatively, also a transformer current sensor or other current sensors may be used.

In an embodiment, the control unit 24 is provided with an input 44 for the actual speed of the railway vehicle 1. In an example, the actual speed of the railway vehicle 1 may be provided by a speed sensor 46. In an embodiment, the speed sensor 46 may be connected directly to wheels of the railway vehicle. In other embodiments a second control unit (not shown) of the railway vehicle 1 provides the control unit 24 with the information the actual speed of the railway vehicle 1.

The control unit 24 is further provided with an input 48 for a clock or time signal. For example, the clock or time signal is provided by a clock 50. In other embodiments, the clock signal is also provided by the second control unit or a third control unit.

Figure 4:
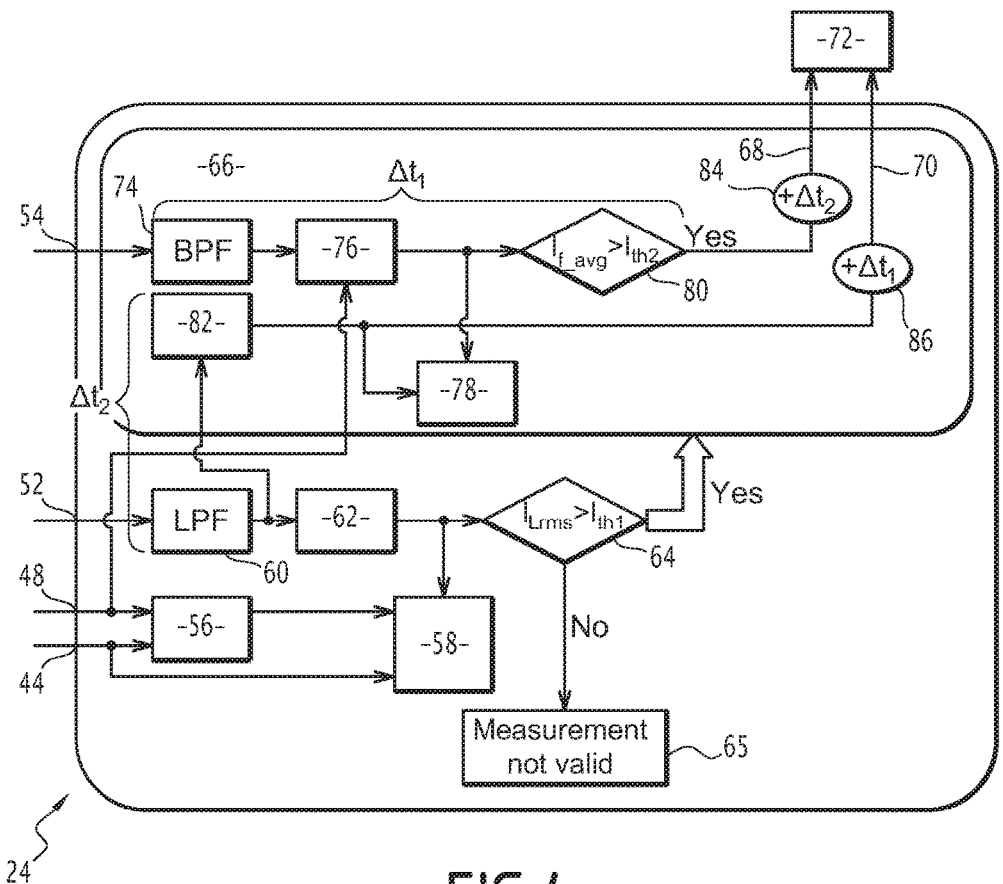
FIG. 4 shows schematically a control unit according to an embodiment of the system.

FIG. 4 shows in more detail an embodiment of the control unit 24. The control unit comprises an input 52 for the measured line current $I_L$ by the second detection unit 42 and an input 54 for the measured filter current $I_F$ by the first detection unit 28.

The control unit 24 comprises a distance calculator 56 for a calculation of the distance using the speed of the train provided on input 44 and the actual time provided on input 48. For example, the distance may be calculated by integrating the actual speed. The speed and the distance are adapted to be recorded by a recording device 58, for example a memory of the control device 24.

The measured line current $I_L$, provided on input 52, is adapted to be filtered by a low pass filter 60. According to an embodiment, the low pass filter 60 removes the disturbances above 1 kHz. Thus, generally, the filtered line current $I_L$ and its harmonics is provided to a block 62, in which a root mean square is calculated. In other words, block 62 is adapted to calculate the effective value of the line current $I_L$. The calculated root mean square $I_{Lrms}$ or the effective value of the line current $I_L$ is compared in comparator 64 with a first threshold $I_{th1}$. Only in case that the root mean square of the line current $I_{Lrms}$ is above the threshold $I_{th1}$, a signal generation portion 66 is activated or its values are taken into account for monitoring the pantograph. If the effective value of the line current $I_L$ is below the first threshold $I_{th1}$ the measurement values are not taken into account and are not valid, see box 65. The first threshold value $I_{th1}$ is determined by the standard EN 50317-2012. The root mean square of the line current $I_{Lrms}$ is also recorded by the recording device 58.

The signal generation portion 66 is adapted to provide, according to an embodiment, a first signal 68 in response to a voltage step of the pantograph, for example by determining an oscillation of the high voltage filter 26, and a second signal 70 in response to a zero crossing of a line current $I_L$.

In particular the signal generation portion 66 detects whether the high voltage filter 26 oscillates at the predetermined frequency due to a connection or disconnection of the pantograph 6 to the catenary 8 when a current is flowing.

The first signal 68 and the second signal 70 are provided to a bouncing detection portion 72 that determines whether and how long a bouncing has occurred and whether an arc was present during bouncing. The bouncing detection portion 72 will be explained later here-below.

The signal generation portion 66 includes a band pass filter 74 which filters the signal representing the filter current $I_F$ coming from the first detection unit 28. The band pass filter 74 is centered on the predetermined oscillation frequency of the high voltage filter 26. For example, in case the oscillation frequency of the high voltage filter 26 is 9 kHz, the band pass filter 74 is centered on 9 kHz. According to an embodiment, a Butterworth filter of the at least third order with, in particular, a quality factor of 10 is used. Also other filter types may be used.

The output of the band pass filter 74 is provided to an average calculator 76. The average calculator is adapted to calculate an average of the signal representing the filtered filter current $I_F$ in a window of 0.1 ms. For that purpose, also the clock input 48 is connected to the average calculator 76. The output of the average calculator is adapted to be recorded by a recording device 78, for example a memory of the control device 24. Further, the output of the average calculator 76 is compared in comparator 80 with a second threshold value $I_{th2}$. The second threshold value is about 0.5 A. In other embodiments the threshold value may be different. For example, the second threshold value is tuned according the type of pantograph and sensibility of the acquisition system. In some embodiments, the second threshold value depends on the window of the average calculator 76. If the output of the average calculator 76 is above the second threshold value $I_{th2}$, the first signal 68 is generated. For example, the first signal 68 is a trigger signal. In other words, if the output of the average calculator 76 is above the second threshold value $I_{th2}$, a connection or a disconnection of the pantograph 6 to the catenary 8 is detected, in particular due to the oscillation of the filter current $I_F$ in the high voltage filter 26.

In other words, according to an embodiment, the high voltage filter 26, the first detection unit 28, the band pass filter 74, the average calculator 76 and the comparator 80 of the signal generation portion may form a voltage step detection device, in particular to detect a voltage step of the pantograph current and, in response of a detected voltage step, to generated the first signal 68.

Further, the signal generation portion 66 comprises a zero crossing detector 82. The output of the low pass filter 60 is provided as input for the zero crossing detector 82. The zero crossing detector 82 is adapted to detect a zero crossing of the line current $I_L$ flowing through a primary side of the traction unit 14 or the primary coil 14a of the transformer 14. Upon a detected zero crossing, the zero crossing detector 82 is adapted to generate the second signal 70. The output of the zero crossing detector 82 is adapted to be recorded by the recording device 78.

In other words the second detection unit 42, the zero crossing detector 82 and optionally the low pass filter 60 form a zero crossing detection device to detect a zero crossing of the line current $I_L$, for example by providing the second signal 70.

In an embodiment, the signal generation portion 66 comprises a first delay block 84 and a second delay block 86. The first delay block 84 is adapted to delay the first signal 68 and the second delay block 86 is adapted to delay the second signal 70. The delay blocks 68, 70 are provided to take into account the different treatment time in the control unit 24 of the signal coming from the first detection unit 28 and the signal coming from the second detection unit 42. For example, the treatment of the signal representing the filter current $I_F$ coming from the first detection unit 28 up to the generation of the first signal 68 needs the time $\Delta t_1$, i.e. the calculation time of the band pass filter 74, the average calculator 76 and the comparator 80. The second signal 70 is adapted to be delayed in delay block 86 by the time $\Delta t_1$. The treatment of the signal representing the line current $I_L$ coming from the second detection unit 42 up to the generation of the second signal 70 takes the time $\Delta t_2$, i.e. a calculation time of the low pass filter 60 and the zero crossing detector 82. The first signal 68 is adapted to be delayed in delay block 84 by $\Delta t_2$. Thus, both signals 68, 70 are synchronized in time before they are provided to the bouncing detection portion 72.

In other embodiments, the synchronization, if necessary, is provided at a different stage of the signal treatment chain, for example before the zero crossing detector 82 and/or the band pass filter 74.

Figure 5:
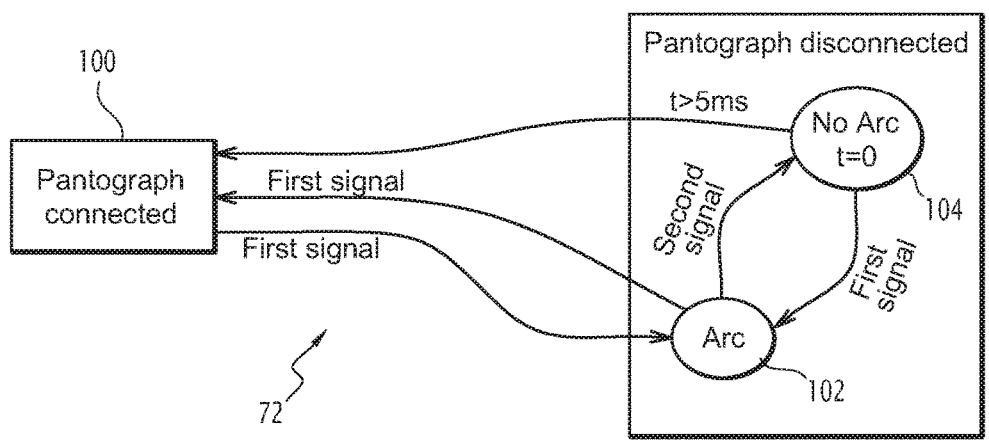
FIG. 5 shows schematically a bouncing detection portion according to an embodiment.

FIG. 5 shows the bouncing detection portion 72 in more detail. The bouncing detection portion 72 comprises a state machine with three different states. The first state 100 defines the case, when the pantograph 6 is connected to the catenary 8. The second state 102 defines the case, when the pantograph 6 is bouncing, i.e. disconnected from the catenary 8 and an arc is produced. The third state 104 defines the case, when the pantograph 6 is disconnected from the catenary 8 and no arc is produced.

In the following the different transitions between the first 100, second 102 and third state 104 are explained, starting from the first state. When the bouncing detection portion 72 receives the first signal 68, i.e. that a voltage step has occurred, the state machine is transitioned to the second state 102. In other words, the bouncing detection portion 72 detects that a pantograph has disconnected from the catenary.

In case the bouncing detection portion 72 receives, when being in the second state 102, again a first signal, i.e. that a voltage step has occurred, the state machine is transitioned to the first state 100. In other words, the bouncing detection portion 72 detects that a pantograph has reconnected to the catenary 8.

In case the bouncing detection portion 72 receives, when being in the second state 102, the second signal, i.e. that a zero crossing of the line current occurs, the state machine is transitioned to the third state 104, as during the zero of the line current $I_L$, which corresponds substantially to the pantograph current I, crossing no arc occurs. At the same time, a counter t is set to zero. It should be noted that the filter current $I_F$ is the difference between Line current $I_L$ and pantograph current I. Since Filter current $I_F$ is an oscillation which expires in a very short time, the pantograph current I is practically line current.

In case the bouncing detection portion 72 receives, when being in the third state 104, the first signal, i.e. that a voltage step has occurred, the state machine is transitioned to the second state 102, as the pantograph 6 is still not reconnected to the catenary 8, so that again an arc is generated.

In case the bouncing detection portion 72 receives, when being in the third state 104, no signal during a specific time period, i.e. that the counter t is above a threshold time, for example 5 ms, the state machine is transitioned to the first state 100, as the pantograph 6 must have reconnected to the catenary 8 during the zero crossing of the line current $I_L$, so that no voltage step is occurred. In other words, if any new first signal appears after 5 ms means that in reality the pantograph has reconnected during the previous line current zero crossing. The time of the zero crossing is considered to be the time of the transition of the third state to the second state.

The threshold time depends on the frequency of the catenary voltage. According to an embodiment, the threshold time is the quarter of period of voltage supply, since it is the time necessary to the line voltage to achieve the peak value. For example in case of 25 kV 50 Hz the period is 20 ms and thus this threshold time is 5 ms. In case of 50 Hz the threshold time is therefore 5 ms. In another example, if the catenary current has 16⅔ Hz, the threshold time is 15 ms. The moment for the reconnection is considered to be the time of the zero crossing.

Thus, the bouncing detection portion 72 is adapted to detect the arc time, the bouncing time and therefore adapted to calculate the value NQ.

Figure 6:
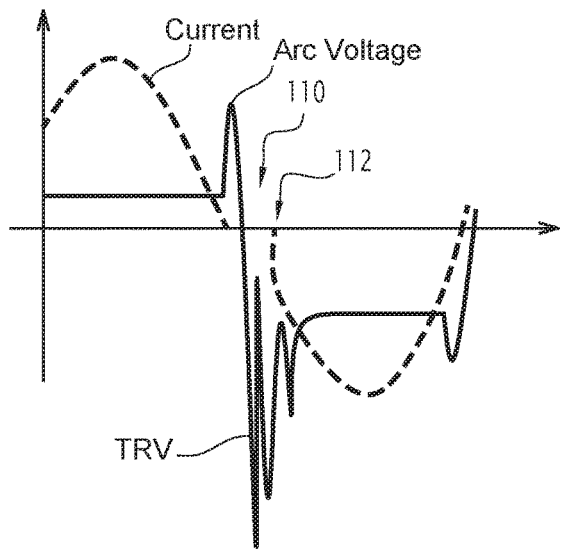
FIG. 6 shows schematically a current and the voltage at the pantograph, when the pantograph is disconnected from the catenary.

FIG. 6 shows schematically a current, here the pantograph current I (dotted line), and the pantograph voltage (continuous line) at the pantograph, when the pantograph 6 is disconnected from the catenary 10. It is evident from FIG. 6, that the pantograph current I is shortly interrupted during a zero crossing 110. Thus during every current zero crossing, the arc is switched off. After the zero crossing of the pantograph current I, the voltage rises strongly, see TRV (transient recovery voltage), and an arc is formed again at 112. Thus, if the pantograph 6 is disconnected from the catenary 10 multiple commutation voltage peaks are formed.

Normally, when the pantograph 6 is connected to the catenary 8 the pantograph voltage, the pantograph voltage has also a sinusoidal form.

Figure 7:
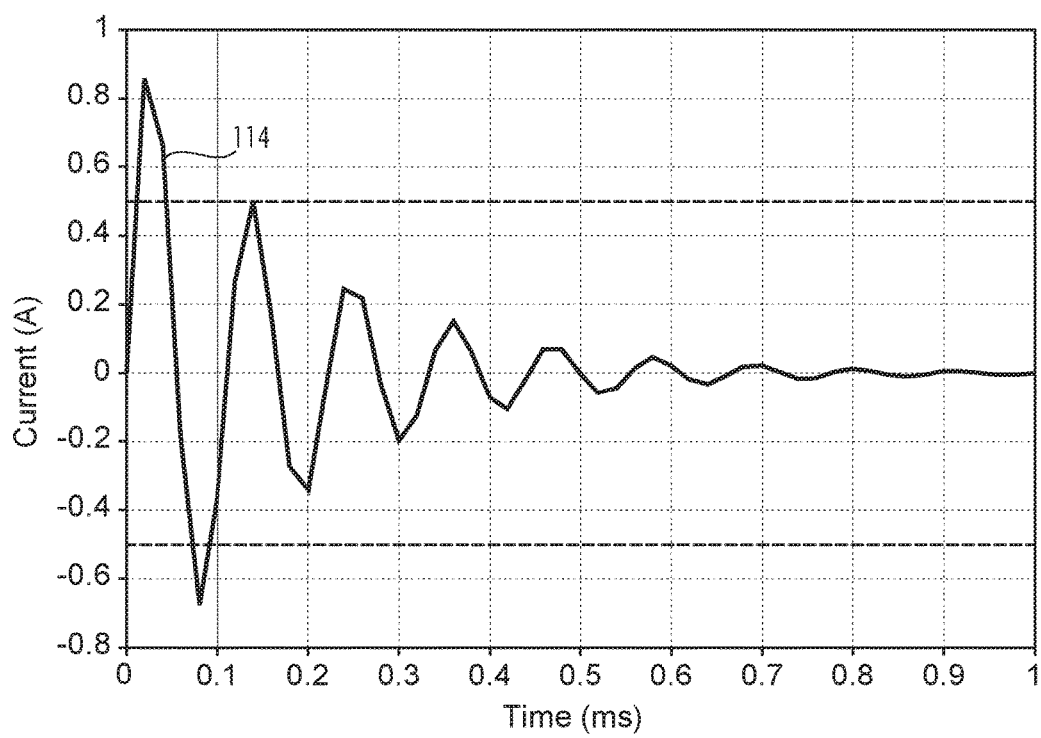
FIG. 7 shows a representation of an oscillating current at the high voltage filter detected by a first detection unit.

FIG. 7 shows a representation of the filter current $I_F$, 114 at the high voltage filter 26 detected by the first detection unit 28, for example after a sudden voltage step, due to a connection or an reattachment of the pantograph 6 to the catenary 8. When, the pantograph 6 is in steady contact with the catenary 8. Then the capacitor 36 is charged. In case of a sudden voltage change, the capacitor 40 is charged, as the inductance 38 acts as open circuit. Then, the capacitor 40 is discharged oscillating through the load, for example through the traction unit 14 and the high voltage filter 26. In such a case the high voltage filter 26 generates the oscillating filter current $I_F$, 114. In the embodiment, the filter current $I_F$ is damped within 1 ms. The (predetermined) oscillating frequency is about 9 kHz as discussed here-above. In other words, the filter current $I_F$ oscillates at the predetermined frequency at every voltage step of the catenary current.

In an embodiment, the signal generation portion 66 detects the oscillation of the filter current $I_F$, 114 and generates the first signal 68.

Figure 8:
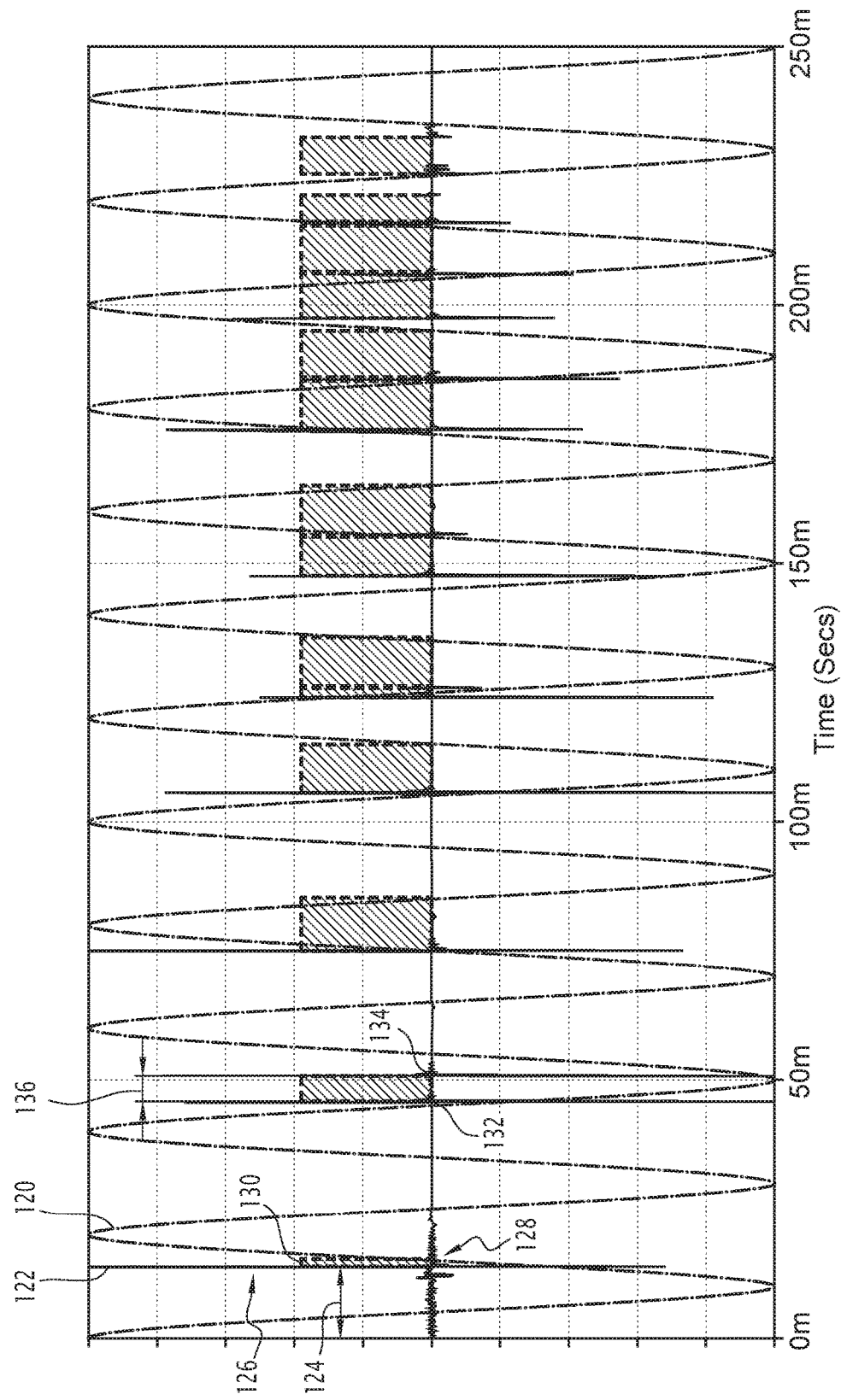
FIG. 8 shows schematically the line current and the current at the high voltage filter with respect to the time.

FIG. 8 shows schematically the line current $I_L$, 120 detected by the second detection unit 42 and the filter current $I_F$, 122 at the high voltage filter 26 detected by the first detection unit 28 with respect to the time. The boxes with the dotted lines indicate the time period during which the bouncing detection portion 72 determines that an arc occurs. The peaks of the filter current 122 indicate the start of an oscillation, which is shown in FIG. 7 in more detail and is detected by the signal generation portion 66 to generate the first signal 68.

During a first period 124, the pantograph 6 is connected to the catenary 8 and the state machine of the bouncing detection portion 72 is in the state 100. In other words, the bouncing detection portion 72 determines that the pantograph 6 is connected to the catenary 8.

Then, at a first point in time 126, the filter current 122 starts oscillating. The signal generation portion 66 detects the oscillation and generates the first signal 68. Then, the state machine of the bouncing detection portion 72 passes over to the state 102 as shown in FIG. 5. Shortly after, at a second point in time 128, the line current $I_L$, 120 crosses the zero. Then, the signal generation portion 66 detects the zero crossing of the line current $I_L$, 120 and generates the second signal 70. The state machine of the bouncing detection portion 72 passes over to the third state 104 as shown in FIG. 5. The timer t is set to zero. As no further signal occurs during the next 5 ms, the state machine passes over to the state 100, whereby the zero crossing time is considered to be the transition time from third state 104 to the first state 100. Thus, the bouncing detection portion 72 could detect the period 130 of the arcing between the first point in time 126 and the second point in time 128, which corresponds to the total bouncing time.

At a third 132 and a fourth 134 point in time the filter current oscillates again and the signal generation portion 66 generates the first signals 68. In this case, the state machine only passes over from the first state 100 to the second state 102 and then again to the first state 100. Thus, the bouncing detection portion 72 determines the period 136 of the arcing between the third and fourth point in time 132, 134.

The further periods when an arcing occurs are also marked with rectangles having dashed lines. Thus, the bouncing detection portion 72 is able to detect the arcing time, the bouncing time and to calculate the value for NQ. In other words, the control unit 24 uses only the filter current, the line current and the time to determine the arc time, the bouncing time and to calculate the index NQ. The speed is only used to correlate the bouncing with the speed and to know also at which point of the catenary the bouncing appears.

The system according to the invention enables a real time measurement and monitoring of the bouncing.

The invention claimed is:

1. A system for monitoring a pantograph of a railway vehicle, the pantograph being adapted to be connected to a catenary and electrically connected to a traction unit, the catenary being adapted to provide an alternating current to the railway vehicle, the system further comprising:
   a voltage step detection device for detecting one or more voltage steps of a pantograph voltage at the pantograph;
   a zero crossing detection device for detecting one or more zero crossings of a line current, the line current being a portion of a pantograph current provided to the traction unit, the pantograph current being the current flowing through the pantograph; and a bouncing detection portion adapted to determine at least one bouncing time of the pantograph based on one or more detected voltage steps of the voltage step detection device and one or more detected zero crossings of the zero crossing detection device.

2. The system according to claim 1, wherein the bouncing detection portion is further adapted to detect at least one arc time of an electrical arc between the pantograph and the catenary based on the one or more detected voltage steps of the voltage step detection device and the one or more detected zero crossings of the zero crossing detection device.

3. The system according to claim 1, wherein the voltage step detection device comprises a signal generation portion, which is adapted to generate a first signal based on each detected voltage step, wherein the bouncing detection portion is adapted to determine the at least one bouncing time of the pantograph based on the first signal.

4. The system according to claim 3, wherein the signal generation portion comprises a band pass filter, which is centered to a predetermined frequency.

5. The system according to claim 3, wherein the zero crossing detection device comprises a zero crossing detector, which is adapted to generate a second signal based on a detected zero crossing of the line current, wherein the bouncing detection portion is adapted to determine the at least one bouncing time of the pantograph based on the second signal and/or first signal.

6. The system according to claim 5, wherein the zero crossing detection device further comprises a second detection unit being adapted to detect the line current, wherein the zero crossing detector is connected to the second detection unit, in particular via a low pass filter, and adapted to generate the second signal based on the detected line current.

7. The system according to claim 1, wherein the voltage step detection device comprises a filter circuit, which is connected in parallel to the traction unit and which is, in particular, adapted to generate an oscillating filter current in response to a voltage step of the pantograph current.

8. The system according to claim 7, wherein the oscillating filter current oscillates in a predetermined frequency.

9. The system according to claim 7, wherein the voltage step detection device comprises a signal generation portion, which is adapted to generate a first signal based on a detected voltage step, wherein the bouncing detection portion is adapted to determine the at least one bouncing time of the pantograph based on the first signal, wherein the voltage step detection device comprises a first detection unit being adapted to detect the oscillations of the filter current, wherein the signal generation portion is connected to the first detection unit and adapted to generate the first signal based on the detected filter current.

10. The system according claim 1, wherein the bouncing detection portion includes a state machine comprising a first state, when the pantograph is connected to the catenary and at least one second state and/or third state, when the pantograph is disconnected from the catenary, wherein the state machine is adapted to pass over between the first, second and/or third states based on a detected voltage step, in particular the first signal, and a detected zero crossing, in particular the second signal, wherein the determined bouncing time is determined based on a first time of the transition from the first state to the second state and a second time of the transition from one of the second or third states back to the first state.

11. The system according to claim 10, wherein the second state defines that there is an arc between the pantograph and the catenary and the third state defines that there is no arc between the pantograph and the catenary, wherein the state machine is adapted to pass over from the second to the third state upon a detected zero crossing, in particular the second signal, and to pass over from the third state to the second state upon a detected voltage step, wherein determined arc time is determined based on the time the state machine is in the second state.

12. A railway vehicle comprising a pantograph adapted to be connected to a catenary, a traction unit electrically connected to the pantograph, and an electric motor connected to the traction unit and a system for monitoring the pantograph of the railway vehicle, the pantograph being adapted to be connected to the catenary and electrically connected to the traction unit, the catenary being adapted to provide an alternating current to the railway vehicle, the system further comprising:

a voltage step detection device for detecting one or more voltage steps of a pantograph voltage at the pantograph, a zero crossing detection device for detecting one or more zero crossings of a line current, the line current being a portion of a pantograph current provided to the traction unit, the pantograph current being the current flowing through the pantograph; and a bouncing detection portion adapted to determine at least one bouncing time of the pantograph based on one or more detected voltage steps of the voltage step detection device and one or more detected zero crossings of the zero crossing detection device.

13. A method for monitoring a pantograph of a railway vehicle, the pantograph being adapted to be connected to a catenary and electrically connected to a traction unit, the catenary being adapted to provide an alternating current to the railway vehicle, the method comprising:

detecting a voltage step of a pantograph voltage at the pantograph, detecting a zero crossing of a line current, the line current being a portion of a pantograph current provided to the traction unit, the pantograph current being the current flowing through the pantograph; and determining at least one bouncing time of the pantograph based on one or more detected voltage steps and one or more detected zero crossings.

14. The method according to claim 13, further comprising detecting at least one arc time of an electrical arc between the pantograph and the catenary based on one or more detected voltage steps and one or more detected zero crossings.

* * * * *